(12) United States Patent
Yang et al.

(10) Patent No.: US 7,763,494 B2
(45) Date of Patent: Jul. 27, 2010

(54) SEMICONDUCTOR DEVICE PACKAGE WITH MULTI-CHIPS AND METHOD OF THE SAME

(75) Inventors: Wen-Kun Yang, Hsin-Chu (TW); Diann-Fang Lin, Hukou Township, Hsinchu County (TW)

(73) Assignee: Advanced Chip Engineering Technology, Inc. (TW)

( * ) Notice: Subject to any disclaimer, the term of this patent is extended or adjusted under 35 U.S.C. 154(b) by 194 days.

(21) Appl. No.: 12/216,658

(22) Filed: Jul. 9, 2008

(65) Prior Publication Data
US 2008/0274593 A1 Nov. 6, 2008

Related U.S. Application Data

(62) Division of application No. 11/707,042, filed on Feb. 16, 2007, now abandoned.

(51) Int. Cl.
*H01L 21/44* (2006.01)
*H01L 21/48* (2006.01)
*H01L 21/50* (2006.01)

(52) U.S. Cl. .................. 438/106; 438/109; 438/112; 438/118

(58) Field of Classification Search ............... 438/106, 438/109, 118, 112, 124, 127, 113, 126
See application file for complete search history.

(56) References Cited

U.S. PATENT DOCUMENTS

| | | | | |
|---|---|---|---|---|
| 6,853,064 B2 * | 2/2005 | Bolken et al. | ................ | 257/686 |
| 7,288,835 B2 * | 10/2007 | Yim et al. | ................ | 257/685 |

* cited by examiner

*Primary Examiner*—Chuong A. Luu
(74) *Attorney, Agent, or Firm*—Bacon & Thomas, PLLC

(57) ABSTRACT

The present invention provides a semiconductor device package with the multi-chips comprising a substrate with at least a die receiving through hole, connecting through holes structure and first contact pads on an upper surface and second contact pads on a lower surface of the substrate. At least a first die having first bonding pads is disposed within the die receiving through hole. A first adhesion material is formed under the die and a second adhesion material is filled in the gap between the die and sidewall of the die receiving though hole of the substrate. Then, a first bonding wire is formed to couple the first bonding pads and the first contact pads. Further, at least a second die having second bonding pads is placed on the first die. A second bonding wire is formed to couple to the second bonding pads and the first contact pads. A dielectric layer is formed on the first and second bonding wire, the first and second die and the substrate.

21 Claims, 9 Drawing Sheets

SEMICONDUCTOR DEVICE PACKAGE WITH MULTI-CHIPS AND METHOD OF THE SAME

This application is a divisional application of pending U.S. patent application Ser. No. 11/707,042 filed Feb. 16, 2007 (of which the entire disclosure of the pending, prior application is hereby incorporated by reference).

BACKGROUND OF THE INVENTION

1. Field of the Invention

This invention relates to a structure of semiconductor device package, and more particularly to a structure of semiconductor device package with multi-chips and method of the same, the structure can reduce the package size and improve the yield and reliability.

2. Description of the Prior Art

In recent years, the high-technology electronics manufacturing industries launch more feature-packed and humanized electronic products. Rapid development of semiconductor technology has led to rapid progress of a reduction in size of semiconductor packages, the adoption of multi-pin, the adoption of fine pitch, the minimization of electronic components and the like. The purposes and the advantages of wafer level package includes decreasing the production cost, decreasing the effect caused by the parasitic capacitance and parasitic inductance by using the shorter conductive line path, acquiring better SNR (i.e. signal to noise ratio).

Because conventional package technologies have to divide a dice on a wafer into respective dies and then package the die respectively, therefore, these techniques are time consuming for manufacturing process. Since the chip package technique is highly influenced by the development of integrated circuits, therefore, as the size of electronics has become demanding, so does the package technique. For the reasons mentioned above, the trend of package technique is toward ball grid array (BGA), flip chip ball grid array (FC-BGA), chip scale package (CSP), Wafer level package (WLP) today. "Wafer level package" is to be understood as meaning that the entire packaging and all the interconnections on the wafer as well as other processing steps are carried out before the singulation (dicing) into chips (dies). Generally, after completion of all assembling processes or packaging processes, individual semiconductor packages are separated from a wafer having a plurality of semiconductor dies. The wafer level package has extremely small dimensions combined with extremely good electrical properties.

In the manufacturing method, wafer level chip scale package (WLCSP) is an advanced packaging technology, by which the die are manufactured and tested on the wafer, and then singulated by dicing for assembly in a surface-mount line. Because the wafer level package technique utilizes the whole wafer as one object, not utilizing a single chip or die, therefore, before performing a scribing process, packaging and testing has been accomplished; furthermore, WLP is such an advanced technique so that the process of wire bonding, die mount and under-fill can be omitted. By utilizing WLP technique, the cost and manufacturing time can be reduced, and the resulting structure of WLP can be equal to the die; therefore, this technique can meet the demands of miniaturization of electronic devices. Further, WLCSP has an advantage of being able to print the redistribution circuit directly on the die by using the peripheral area of the die as the bonding points. It is achieved by redistributing an area array on the surface of the die, which can fully utilize the entire area of the die. The bonding points are located on the redistribution circuit by forming flip chip bumps so the bottom side of the die connects directly to the printed circuit board (PCB) with micro-spaced bonding points.

Although WLCSP can greatly reduce the signal path distance, it is still very difficult to accommodate all the bonding points on the die surface as the integration of die and internal components gets higher. The pin count on the die increases as integration gets higher so the redistribution of pins in an area array is difficult to achieve. Even if the redistribution of pins is successful, the distance between pins will be too small to meet the pitch of a printed circuit board (PCB). That is to say, such process and structure of prior art will suffer yield and reliability issues owing to the huge size of package. The further disadvantage of former method are higher costs and time-consuming for manufacture.

WLP technique is an advanced packaging technology, by which the die are manufactured and tested on the wafer, and then the wafer is singulated by dicing for assembly in a surface-mount line. Because the wafer level package technique utilizes the whole wafer as one object, not utilizing a single chip or die, therefore, before performing a scribing process, packaging and testing has been accomplished; furthermore, WLP is such an advanced technique so that the process of wire bonding, die mount and under-fill can be omitted. By utilizing WLP technique, the cost and manufacturing time can be reduced, and the resulting structure of WLP can be equal to the die; therefore, this technique can meet the demands of miniaturization of electronic devices.

Though the advantages of WLP technique mentioned above, some issues still exist influencing the acceptance of WLP technique. For instance, the coefficient of thermal expansion (CTE) difference (mismatching) between the materials of a structure of WLP and the mother board (PCB) becomes another critical factor to mechanical instability of the structure. A package scheme disclosed by U.S. Pat. No. 6,271,469 suffers the CTE mismatching issue. It is because the prior art uses silicon die encapsulated by molding compound. As known, the CTE of silicon material is 2.3, but the CTE of molding compound is around 20-80. The arrangement causes chip location be shifted during process due to the curing temperature of compound and dielectric layers materials are higher and the inter-connecting pads will be shifted that will causes yield and performance problem. It is difficult to return the original location during temperature cycling (it caused by the epoxy resin property if the curing Temp near/over the Tg). It means that the prior structure package can not be processed by large size, and it causes higher manufacturing cost.

Further, some technical involves the usage of die that directly formed on the upper surface of the substrate. As known, the pads of the semiconductor die will be redistributed through redistribution processes involving a redistribution layer (RDL) into a plurality of metal pads in an area array type. The build up layer will increase the size of the package. Therefore, the thickness of the package is increased. This may conflict with the demand of reducing the size of a chip.

Moreover, the prior art suffers complicated process to form the "Panel" type package. It needs the mold tool for encapsulation and the injection of mold material. It is unlikely to control the surface of die and compound at same level due to warp after heat curing the compound, the CMP process may be needed to polish the uneven surface. The cost is therefore increased.

In view of the aforementioned, the present invention provides a new structure with multi-chips and method for a panel scale package (PSP) to overcome the above drawback.

SUMMARY OF THE INVENTION

The present invention will descript some preferred embodiments. However, it is appreciated that the present invention can extensively perform in other embodiments except for these detailed descriptions. The scope of the present invention is not limited to these embodiments and should be accorded the following claims.

One objective of the present invention is to provide a structure of semiconductor device package and method of the same, which can provide a new structure of super thin package.

Another objective of the present invention is to provide a structure of semiconductor device package and method of the same, which can allow a better reliability due to the substrate and the PCB have the same coefficient of thermal expansion (CTE).

Still another objective of the present invention is to provide a structure of semiconductor device package and method of the same, which can provide a simple process for forming a semiconductor device package.

Yet another objective of the present invention is to provide a structure of semiconductor device package and method of the same, which can lower cost and higher yield rate.

Another objective of the present invention is to provide a structure of semiconductor device package and method of the same, which can provide a good solution for low pin count device.

The present invention provides a structure of semiconductor device package comprising a substrate with at least a die receiving through hole, connecting through holes structure and first contact pads on an upper surface and second contact pads on a lower surface of the substrate; at least a first die having first bonding pads disposed within the die receiving through hole; a first adhesion material formed under the first die; a second adhesion material filled in the gap between the first die and sidewalls of the die receiving though hole of the substrate; a first bonding wire formed to couple to the first bonding pads and the first contact pads; at least a second die having second bonding pads disposed on the first die; a second bonding wire formed to couple to the second bonding pads and the first contact pads; a die attached tape formed under the second die; and a dielectric layer formed on the first and second bonding wire, the first and second die and the substrate.

The present invention provides a method for forming a semiconductor device package comprising providing at least a substrate with a die receiving through hole, connecting through holes structure and first contact pads on an upper surface and second contact pads on a lower surface of the substrate; redistributing desired at least first die having first bonding pads on a die redistribution tool with desired pitch by a pick and place fine alignment system; bonding the substrate to the die redistribution tool; filling a first adhesion material on the back side of the die; filling a second adhesion material into the space between the die edge and the die receiving through hole of the substrate, it maybe fill the first and second adhesion materials at the same time by using the same materials; separating the "panel" (panel form means substrate with die and adhesion together) from the die redistribution tool; forming a first bonding wire to connect the first bonding pads and the first contact pads; placing at least a second die having second bonding pads on the first die; forming a second bonding wire to connect the second bonding pads and the first contact pads; forming second bonding wire to connect the second bonding pads to the second contact pads; printing or molding or dispensing a dielectric layer on the active surface of the first die and upper surface of the substrate; and mounting the package structure (in panel form) on a tape to saw into individual die for singulation.

The present invention provides a method for forming a semiconductor device package comprising providing a substrate with at least a die receiving through hole, connecting through hole structure and first contact pads on an upper surface and second contact pads on a lower surface of the substrate; bonding the substrate to a die redistribution tool; redistributing desired at least first die having first bonding pads on the die redistribution tool with desired pitch into the die receiving through hole of the substrate by a pick and place fine alignment system; forming a first bonding wire to connect the first bonding pads and the first contact pads; placing at least a second die (with adhesion tape on the back side of die) having second bonding pads on the first die; forming a second bonding wire to couple the second bonding pads and the first contact pads; forming a dielectric layer on the active surface of the first and second die and upper surface of the substrate and the gap between the first die and sidewall of the die receiving through hole; separating the "panel" (panel form means substrate with the die and the adhesion material—in here is dielectric layer) from the die redistribution tool; and mounting the package structure (in panel form) on a tape to saw into individual die for singulation.

BRIEF DESCRIPTION OF THE DRAWINGS

The foregoing aspects and many of the attendant advantages of this invention will become more readily appreciated as the same becomes better understood by reference to the following detailed description, taken in conjunction with the accompanying drawings, wherein.

DESCRIPTION OF THE PREFERRED EMBODIMENT

In the following description, numerous specific details are provided in order to give a through understanding of embodiments of the invention. Referring now to the following description wherein the description is for the purpose of illustrating the preferred embodiments of the present invention only, and not for the purpose of limiting the same. One skilled in the relevant art will recognize, however, that the invention may be practiced without one or more of the specific details, or with other methods, components, materials, etc.

Figure 1:
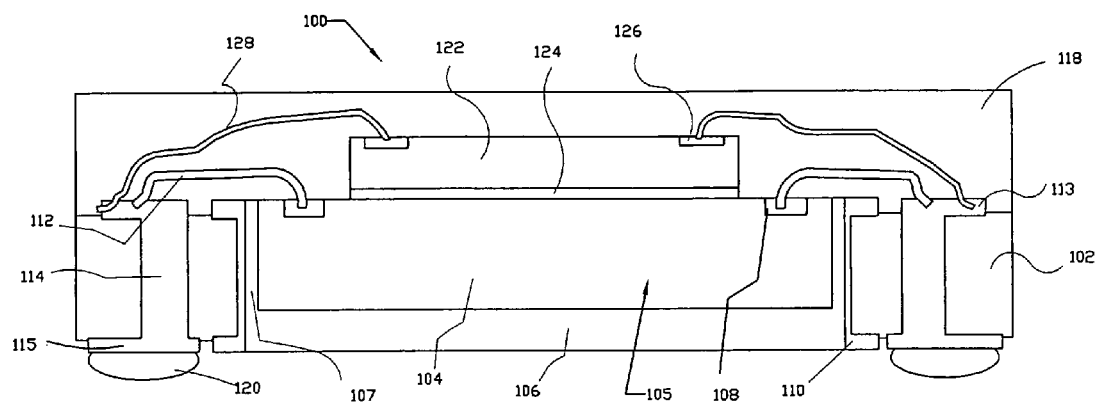
FIG. 1 illustrates is a cross-section diagram of a structure of semiconductor device package according to one embodiment of the present invention.

Referring to FIG. 1, it is a cross-section diagram of a structure of semiconductor device package 100 according to one embodiment of the present invention. The package 100 comprises a substrate 102, a first die 104, a die receiving through hole 105, a first adhesion material 106, a second adhesion material 107, first bonding pads 108, a metal or conductive layer 110, a first bonding wire 112, first contact pads 113, connecting through holes structure 114, second contact pads 115, a second die 122, second bonding pads 126, a die attached tape 124, a second bonding wire 128, a dielectric layer 118 and a plurality of conductive bumps 120.

In FIG. 1, the substrate 102 has a die receiving through hole 105 formed therein to receive a first die 104. The die receiving through hole 105 is formed from the upper surface of the substrate 102 through the substrate 102 to the lower surface of the substrate 102. The die receiving through hole 105 is pre-formed within the substrate 102. The first adhesion material 106 is coated (taped) under the lower surface of the first die 104, thereby sealing the first die 104. The second adhesion material 107 is also refilled within the space between the edge of first die 104 and the sidewalls of the die receiving through holes 105. It maybe uses the same material for both the first adhesion material 106 and the second adhesion material 107.

The substrate 102 further comprises the connecting through holes structure 114 formed therein. The first contact pads 113 and the second contact pads 115 (for organic substrate) are respectively formed on the upper surface and lower surface of the connecting through holes structure 114 and partial part of the upper surface and lower surface of the substrate 102. The conductive material is re-filled into the connecting through holes structure 114 for electrical connection, it is pre-formed process once making the substrate 102.

Optional, a metal or conductive layer 110 is coated on the sidewall of the die receiving through hole 105, that is to say, the metal layer 110 is formed between the first die 104 surrounding by the second adhesion material 107 and the substrate 102. It can improve the adhesion strength between die edge and sidewall of the die receiving through hole 105 of the substrate 102 by using some particular adhesion materials, especially for the rubber type adhesion materials.

The first die 104 is disposed within the die receiving through holes 105 on the substrate 102. As know, first bonding pads 108 are formed within the upper surface of the first die 104. A first bonding wire 112 is formed to couple to the first bonding pads 108 and the first contact pads 113.

The present invention further comprises a second die 122 formed on a die attached tape 124 and then placed on the active surface of the first die 104. In other words, the second die 122 is placed on the first die 104 to expose the first bonding pads 108 for electrical connection. The second die 122 has a plurality of second bonding pads 126 formed on the upper surface of the second die 122. A second bonding wire 128 is formed to couple to the second bonding pads 126 and the first contact pads 113. Next, a dielectric layer 118 is formed to cover the first bonding wire 112, the second bonding wire 128, the upper surface of the first die 104 and the second die 122 and the substrate 102.

Then, a plurality of conductive bumps 120 are formed and coupled to the second contact pads 115 by printing the solder paste on the surface, followed by performing re-flow process to reflow the solder paste. Accordingly, the first die 104 and the second die 122 can be electrically connected with the conductive bumps 120 via the through holes structure 114, the first bonding wire 112 and the second bonding wire 128.

The dielectric layer 118 is employed to prevent the package from external force that may causes damage to the package. The metal layer 110 and the second adhesion material 107 act as buffer areas that absorb the thermal mechanical stress between the first die 104 and substrate 102 during temperature cycling due to the second adhesion material 107 has elastic property. The aforementioned structure constructs LGA type package (peripheral type).

In one embodiment, the material of the substrate 102 includes epoxy type FR5, FR4 or BT (Bismaleimide triazine epoxy). The material of the substrate 102 also can be metal, alloy, glass, silicon, ceramic or print circuit board (PCB). The alloy further includes alloy 42 (42% Ni-58% Fe) or Kovar (29% Ni-17% Co-54% Fe). Further, the alloy metal is preferably composed by alloy 42 that is a nickel iron alloy whose coefficient of expansion makes it suitable for joining to silicon chips in miniature electronic circuits and consists of nickel 42% and ferrous (iron) 58%. The alloy metal also can be composed by Kovar which consists of nickel 29%, cobalt 17% and ferrous (iron) 54%.

Preferably, the material of the substrate 102 is organic substrate likes epoxy type FR5, BT, PCB with defined through holes or Cu metal with pre etching circuit. Preferably, the coefficient of thermal expansion (CTE) is the same as the one of the mother board (PCB), and then the present invention can provide a better reliability structure due to the CTE of the substrate 102 is matching with the CTE of the PCB (or mother board) accordingly. Preferably, the organic substrate with high Glass transition temperature (Tg) are epoxy type FR5 or BT (Bismaleimide triazine) type substrate. The Cu metal (CTE around 16) can be used also. The glass, ceramic, silicon can be used as the substrate. The second adhesion material 107 is formed of silicone rubber elastic materials.

In one embodiment, the material of the first adhesion material 106 and the second adhesion material 107 include ultra-violet (UV) curing type and thermal curing type material, epoxy or rubber type material. The first adhesion material 106 also can be included the metal material. Further, the material of the dielectric layer 118 includes liquid compound, resin, silicone rubber and also can be benzocyclobutene (BCB), Siloxane polymer (SINR) or polyimide (PI).

In one embodiment, the material of the die attached tape 124 includes, but not limiting to, elastic material. The die attached tape 124 has space balls inside which acts as buffer area that absorbs the thermal mechanical stress between the first die 104 and the second die 122 during temperature cycling and UV curing.

Figure 2A:
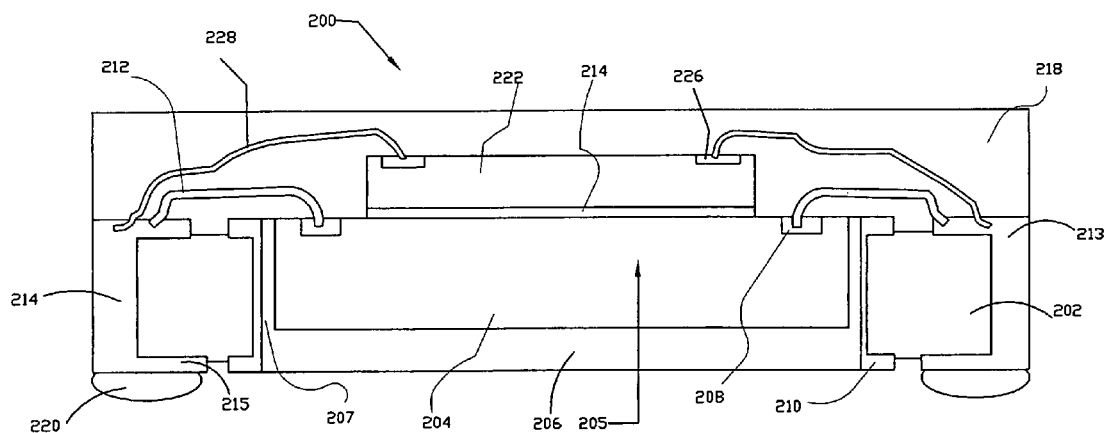
FIG. 2a illustrates is a cross-section diagram of a structure of semiconductor device package according to another embodiment of the present invention.

Referring to FIG. 2a, it is a cross-section diagram of a structure of semiconductor device package 200 according to another embodiment of the present invention. The substrate 202 comprises the connecting through holes structure 214 formed on four sides of the substrate 202, that is to say, the connecting through holes structure 214 is respectively formed on both lateral sides of the substrate 202 (maybe four end sides). The first contact pads 213 and the second contact pads 215 are respectively formed on the upper surface and lower surface of the connecting through holes structure 214 and partial part of the upper surface and lower surface of the substrate 202. The conductive material is re-filled into the connecting through holes structure 214 for electrical connection.

Further, the package structure 200 comprises a second die 222 having a plurality of second bonding pads 226 formed on the upper surface of the second die 222. The second die 222 is formed on a die attached tape 224, followed by placing the second die 222 on the active surface of the first die 204. In other words, the second die 222 is placed on the first die 204 to expose the first bonding pads 208 for electrical connection. A second bonding wire 218 is formed to couple the second bonding pads 226 and the first contact pads 213. Then, a plurality of conductive bumps 220 are coupled to the second contact pads 215. Accordingly, the first bonding pads 208 formed within the first die 204 and the second bonding pads 226 formed within the second die 222 can be electrically connected with the conductive bumps 220 by the connecting through holes structure 214, the first bonding wire 212 and the second bonding wire 228.

Optionally, a metal or conductive layer 210 is coated on the sidewall of the die receiving through hole 205, namely, the metal layer 210 is formed between the first die 204 surrounding by the second adhesion material 207 and the substrate 202.

Further, various elements in the package 200 are similar to the elements in the package 100, as shown in FIGS. 1 and 2, and therefore, the detailed description is omitted.

Figure 2B:
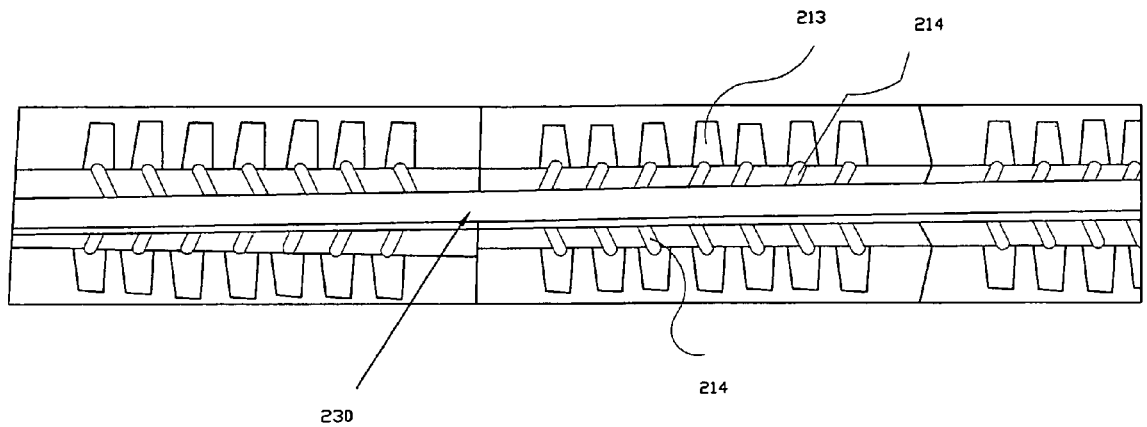
FIG. 2b illustrates is a cross-section diagram of a structure of semiconductor device package according to another embodiment of the present invention.

In FIG. 2b, illustrates is a cross-section diagram of a structure of semiconductor device package 200 according to the present invention. The first contact pads 213 are formed over the connecting through holes structure 214. The connecting through holes structure 214 is located in the scribe line 230. In other words, each package has half through holes structure 214 after sawed. It can improve the solder join quality during SMT process and also can reduce the foot print. Similarly, the structure of half through holes structure 214 can be formed on the sidewall of the die receiving through hole 205 (does not show on the drawing), it can replace the conductive layer 210. Optionally, the above through holes structure 214 is also called the connecting trench.

Figure 3:
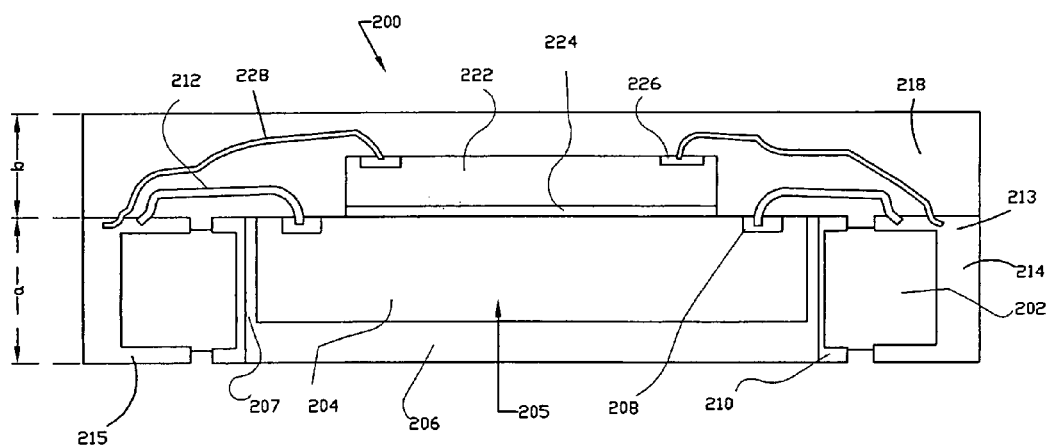
FIG. 3 illustrates is a cross-section diagram of a structure of semiconductor device package according to another embodiment of the present invention.

Referring to FIG. 3, it is a cross-section diagram of a structure of semiconductor device package 200 according to the present invention. An alternative embodiment can be seen in FIG. 3, a package structure 200 can be formed without the conductive bumps 220 on the second terminal pads 215. The other parts are similar to FIG. 1, therefore, the detailed description is omitted.

Preferably, the thickness a from the surface of the layer 118 to the upper surface of the substrate 102 is approximately 118-218 µm. The thickness b from the upper surface of the substrate 102 is approximately 100-150 µm. Accordingly, the present invention can offer a super thin structure having a thickness less than 500 µm, and the package size is approximately around the die size plus 0.5 mm to 1 mm per side to form a chip scale package (CSP) by using the conventional process of print circuit board.

Figure 4:
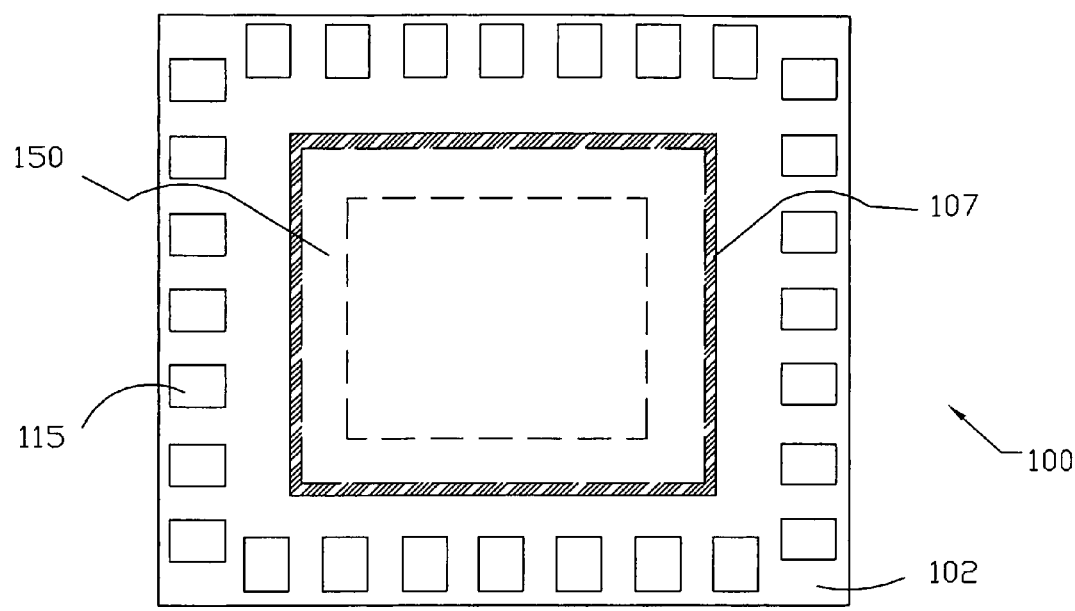
FIG. 4 illustrates a bottom view diagram of a structure of semiconductor device package according to the present invention.

Referring to FIG. 4, it illustrates a bottom view diagram of a structure of semiconductor device package 100 according to the present invention. The back side of the package 100 includes the substrate 102 (solder mask layer is not showed on the drawing) and the second adhesion layer 107 formed therein and surrounded by a plurality of second contact pads 115. The package 100 comprises a metal layer 150 sputtering or electro-plating on back side of the first die 104 to replace the first adhesion material 106, it maybe enhance the thermal conductivity, as shown in the external dotted area. The internal dotted area is an indicated area as the area of the second die 122. The metal layer 150 can be solder join with printed circuit board (PCB) by solder paste, it can exhaust the heat (generate by die) through the copper metal of print circuit board.

Figure 5:
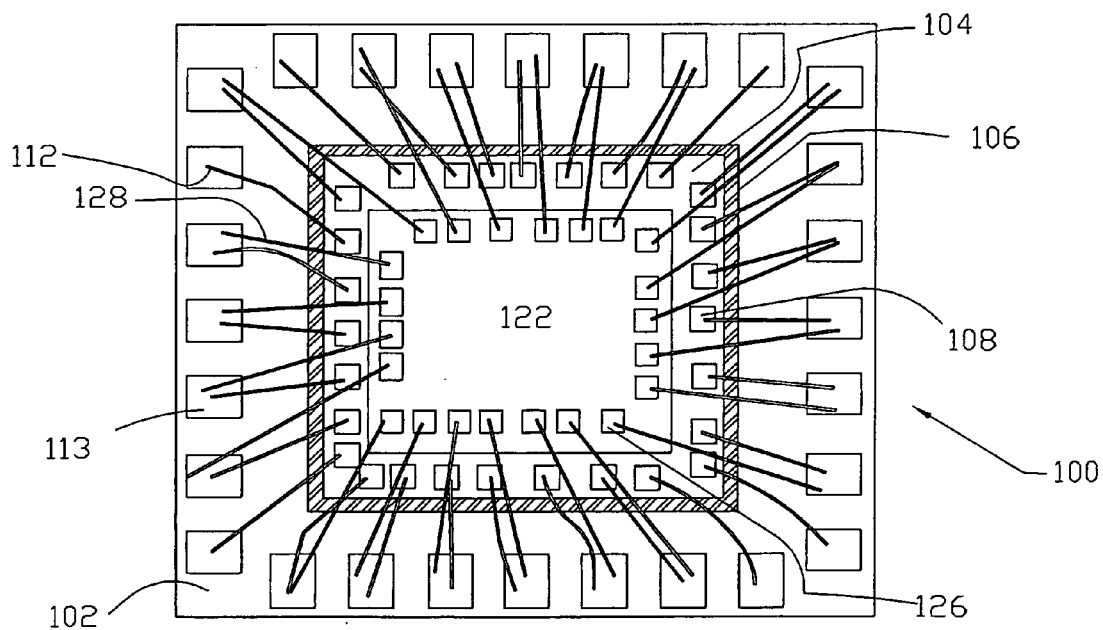
FIG. 5 illustrates a top view diagram of a structure of semiconductor device package according to one embodiment of the present invention.

Referring to FIG. 5, it illustrates a top view diagram of a structure of semiconductor device package 100 according to the present invention. The top side of package 100 includes the substrate 102, a first die 104 formed on the first adhesion material 106. A plurality of first contact pads 113 are formed surrounding around the edge areas of the substrate 102. The first bonding wire 112 is formed to couple the first bonding pads 108 and the first contact pads 113. Further, a second die 122 is formed on the first die 104 to expose the first bonding pads 108. The second bonding wire 128 couples to the second bonding pads 126 and the first contact pads 113. It is noted that the bonding wire 112 and the second bonding wire 128 are invisible after the formation of the dielectric layer 118.

Otherwise, the package 100 can be applied to higher pin counts. The embodiment is similar to FIG. 5, therefore, the detailed description is omitted. Accordingly, the peripheral type of the present invention can provide a good solution for low pin count device.

According to the aspect of the present invention, the present invention further provides a method for forming a semiconductor device package 100 with multi-chips, such as the first die 104 and the second die 122. Refer to FIG. 6a-6d, they illustrate a cross-section diagrams of a method of forming a semiconductor device package 100. The steps are as follows and the following steps also can be referred to FIG. 7a-7f due to they are similar.

Figure 6A:
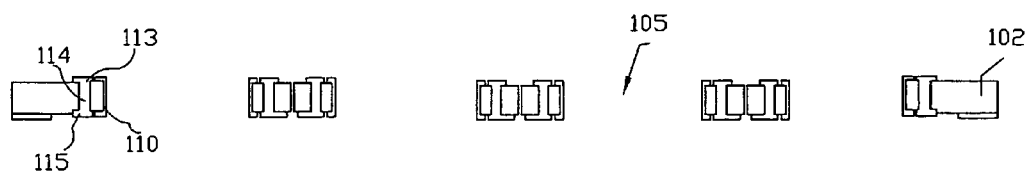
FIG. 6a-6d illustrate cross-section diagrams of a method of forming a semiconductor device package according to one embodiment of the present invention.
Figure 6B:
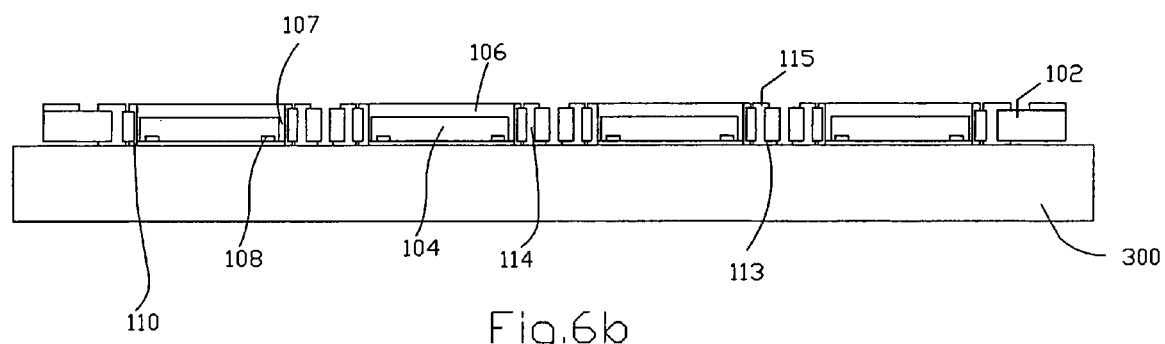

First, the substrate 102 with the die receiving through holes 105, connecting through holes structure 114 and the first contact pads 113 on an upper surface and the second contact pads 115 on a lower surface of the substrate 102 is provided, wherein the die receiving through holes 105 and the connecting through holes structure 114 and the first contact pads 113 and the second contact pads 115 are preformed within the substrate 102, as shown in FIG. 6a. The desired first die 104 having first bonding pads 108 are redistributed on a die redistribution tool 300 with desired pitch by a pick and place fine alignment system, as shown in FIG. 6b. The substrate 102 is bonding to the die redistribution tool 300, that is to say, the active surface of the die 104 is sticking on the die redistribution tool 300 printed by patterned glues (not shown). After the second adhesion material 107 filled into the space between the first die 104 and the first adhesion material 106 on back side of the first die 104, the first and second adhesion material 106 and 107 are cured, in this application, it maybe the same materials for the first adhesion material 106 and the second adhesion material 107. Then, the package structure is separated from the die redistribution tool 300.

Figure 6C:
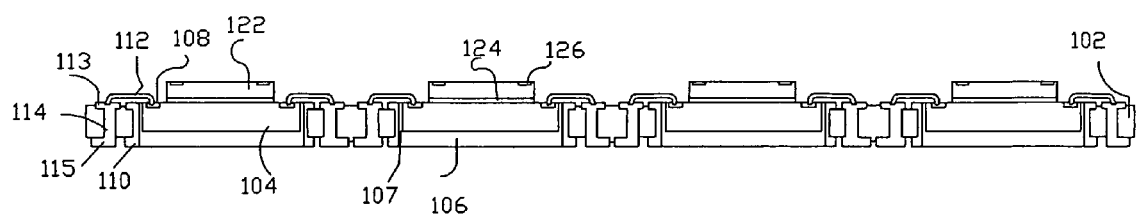

After cleaning the top surface of the first bonding pads 108 and the first contact pads 113 (the pattern glues may residue on the surface of first bonding pads 108 and first contact pads 113), the first bonding wire 112 is formed to connect the first bonding pads 108 to the first contact pads 113, as shown in FIG. 6c. Subsequently, a second die 204 is formed on the die attached tape 214 and followed by placing the die 204 on the first die 202. The second die 204 does not cover the first bonding pads 108, so that the first bonding pads 108 are exposed for electrical connection. The second die 202 has the second bonding pads 126 formed thereon. Then, the second bonding wire 128 is coupled the second bonding pads 126 and the first contact pads 113.

Figure 6D:
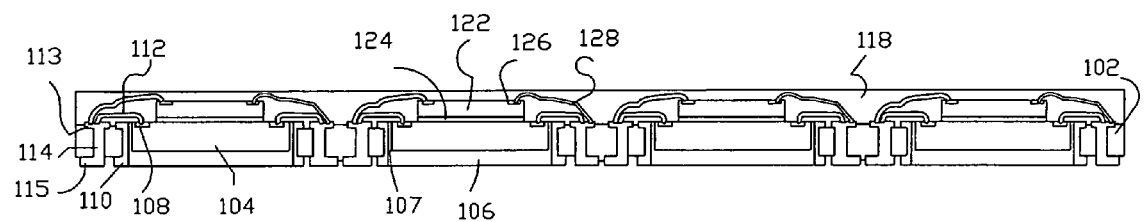

Next, the dielectric layer 118 is coated (or molding or printing or dispensing) and cured on the active surface of the first die 104, the second die 122 and upper surface of the substrate 102 in order to protect the first bonding wire 112, the first die 104, the second bonding wire 128, the second die 122 and the substrate 102, as shown in FIG. 6d. The terminal contact pads are formed on the second contact pads 115 by printing the solder paste (or ball). Then, the plurality of conductive bumps 120 are formed by an IR reflow method and coupled to the second contact pads 115. Subsequently, the package structure is mounting on a tape 302 for die singulation.

Optionally, a metal or conductive layer 110 is formed on the sidewall of die receiving through hole 105 of the substrate 102, the metal is pre-formed during the manufacture of the substrate. A metal film (or layer) can be sputtered or plated on the back side of the first die 104 as the first adhesion material 106 for better thermal management inquiry.

Figure 7A:
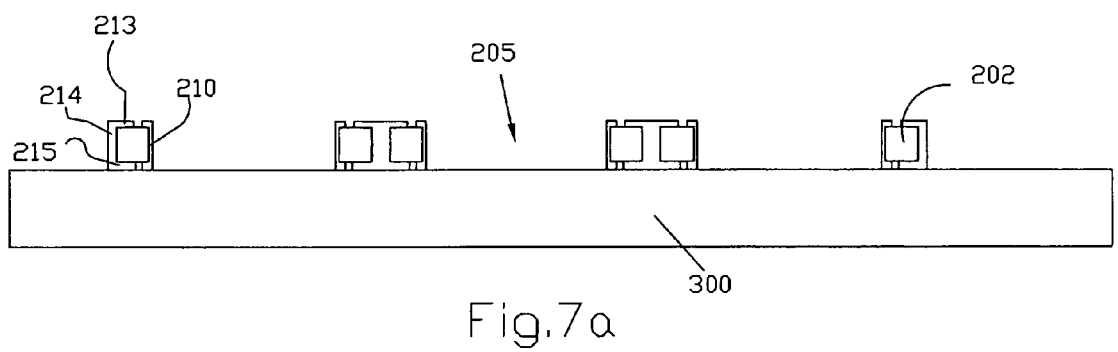
FIG. 7a-7g illustrate cross-section diagrams of a method of forming a semiconductor device package according to another embodiment of the present invention.
Figure 7B:
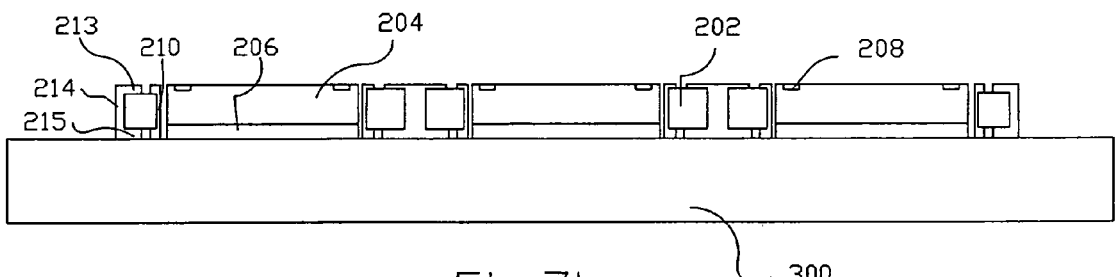
Figure 7C:
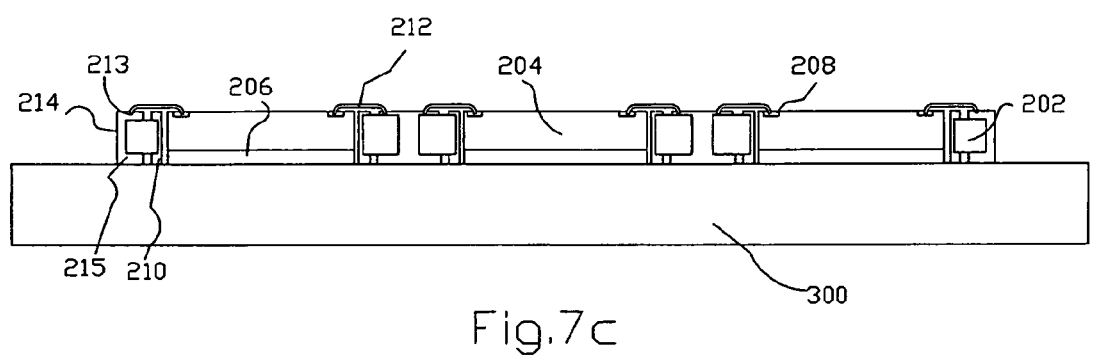

According to another aspect of the present invention, the present invention also provides another method for forming a semiconductor device package 200 with the die receiving through holes 205 and the connecting through holes structure 214. Refer to FIG. 7a-7h they illustrate cross-section diagrams of a method of forming a semiconductor device package 200 according to the present invention The steps of forming the package 200 comprises providing a substrate 202 with die receiving through holes 205, connecting through holes structure 215 and the first contact pads 213 on an upper surface and a second contact pads 215 on a lower surface of the substrate 202. The substrate 202 is bonding to a die redistribution tool 300, as shown in FIG. 7a. In other words, the active surface (for solder join) of the substrate 202 is sticking on the die redistribution tool 300 printed by patterned glues (not shown). The desired first die 204 has first bonding pads 208 formed on the upper surface of the first die 204, and the first adhesion material 206 (optional—it maybe the adhesion tape) is formed on the back side of the first die 204, as shown in FIG. 7b. The first die 204 is redistributed on the die redistribution tool 300 with desired pitch by a pick and place fine alignment system. Then, the first bonding wire 212 is formed to connect the first bonding pads 208 to the first contact pads 213, as shown in FIG. 7c.

Figure 7D:
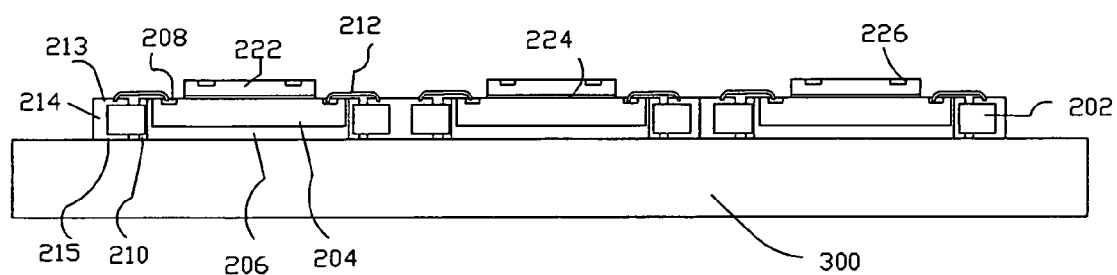
Figure 7E:
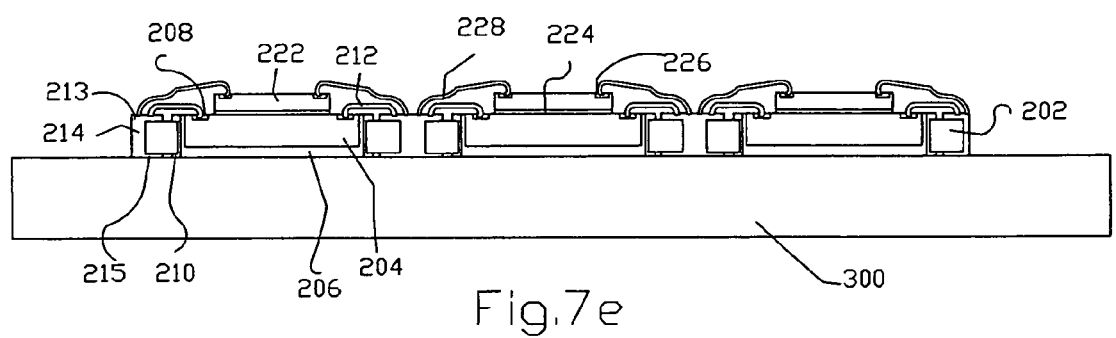

Subsequently, the second die 222 is formed on the die attached tape 224 and then formed on the first die 204 to expose the first bonding pads 208, as shown in FIG. 7d. The second die 222 has the second bonding pads 226 formed within the second die 222. Then, the first adhesion material 206 and the die attached tape 224 are cured. The second bonding wire 228 is formed to couple the second bonding pads 226 and the first contact pads 213, as shown in FIG. 7e.

Figure 7F:
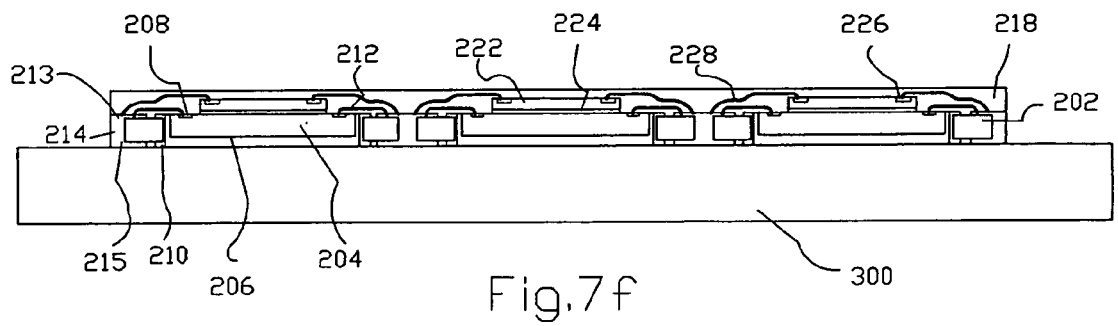
Figure 7G:
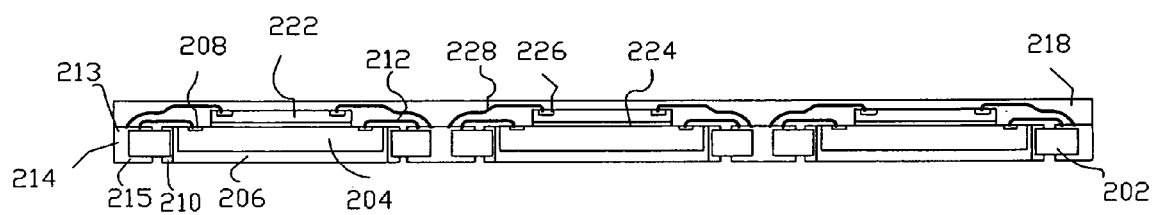

Next, the dielectric layer 218 is formed on the active surface of the first die 204, the second die 222 and upper surface of the substrate 202 to fully cover the first bonding wire 212 and the second bonding wire 228 and fill into the gap between die edge and sidewall of die receiving through hole 205 as second adhesion material 207, as shown in FIG. 7f, and then the dielectric layer 218 is cured. After the package structure separated from the die redistribution tool 300, the back side of the substrate 202 and the first adhesion material 206 are cleaned, as shown in FIG. 7g.

Alternatively, the terminal contact pads are formed on the second contact pads 215 by printing the solder paste (or ball). Optionally, the plurality of conductive bumps 220 are formed and coupled to the second contact pads 215. Subsequently, the package structure 200 is mounted on a tape 302 for die singulation.

Figure 7H:
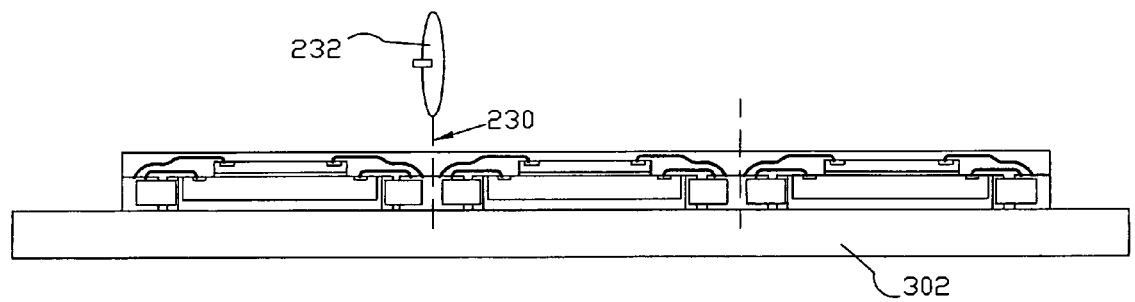

In one embodiment, a conventional sawing blade 232 is used during the singulation process. The blade 232 is aligned to the scribe line 230 to separate the dice into individual die during the singulation process, as shown in FIG. 7h.

Optionally, a metal or conductive layer 210 is formed on the sidewall of die receiving through hole 205 of the substrate 202, it is pre-formed as mentioned above. Another process is used to form the first adhesion material 206 by using the steps including seed metal sputtering, patterning, electro-plating (Cu), PR stripping, metal wet etching etc. to achieve the metal layer 150.

In one embodiment, the step of forming the conductive bumps 120 and 220 are performed by an infrared (IR) reflow method.

It is noted that the material and the arrangement of the structure are illustrated to describe but not to limit the present invention. The material and the arrangement of the structure can be modified according to the requirements of different conductions.

According to the aspect of the present invention, the present invention provides a structure of semiconductor device with the die receiving through hole and the connecting through holes structure, that provides a structure of super thin package which the thickness is less than 500 µm and the package size is slight large than the die size. Further, the present invention provides a good solution for low pin count device due to the peripheral type format. The present invention provides a simple method for forming a semiconductor device package which can improve the reliability and yield. Moreover, the present invention further provides a new structure that has multi-chips, and therefore can also minimize the size of chip scale package structure and lower costs due to the lower cost material and the simple process. Therefore, the super thin chip scale package structure and method of the same disclosed by the present invention can provide unexpected effect than prior art, and solve the problems of prior art. The method may apply to wafer or panel industry and also can be applied and modified to other related applications.

As will be understood by a person skilled in the art, the foregoing preferred embodiments of the present invention are illustrative of the present invention, rather than limiting the present invention. Having described the invention in connection with a preferred embodiment, modification will suggest itself to those skilled in the art. Thus, the invention is not to be limited by this embodiment. Rather, the invention is intended to cover various modifications and similar arrangements included within the spirit and scope of the appended claims, the scope of which should be accorded the broadest interpretation so as to encompass all such modifications and similar structures.

What is claimed is:

1. A method for forming a semiconductor device package, comprising:

providing a substrate with at least a die receiving through hole, connecting through holes structure and first contact pads on an upper surface and second contact pads on a lower surface of said substrate;

redistributing desired at least first die having first bonding pads on a die redistribution tool with desired pitch by a pick and place fine alignment system;

bonding said substrate to said die redistribution tool;

filling a first adhesion material on the back side of said dice;

filling a second adhesion material into the space between said dice edge and said dice receiving through hole of said substrate;

separating said package structure from said die redistribution tool;

forming a first bonding wire to connect said first bonding pads to said first contact pads;

placing at least a second die having second bonding pads on said first die;

forming a second bonding wire to connect said second bonding pads and said first contact pads;

printing a dielectric layer on the active surface of said first and second die and upper surface of said substrate; and mounting said package structure on a tape to saw into individual die for singulation.

2. The method in claim 1, further comprising a step of welding a plurality of soldering bumps on said terminal pads.

3. The method in claim 2, wherein said step of forming said soldering bumps is performed by an infrared (IR) reflow method.

4. The method in claim 2, wherein said step of forming said conductive bumps on said second contact pads is performed by solder paste.

5. The method in claim 1, further comprising a step of sticking active surface of said first die on said die redistribution tool printed by patterned glues.

6. The method in claim 1, further comprising a step of curing said first and second adhesion material.

7. The method in claim 1, further comprising a die attached tape formed under said second die.

8. The method in claim 7, wherein material of said die attached tape includes elastic material.

9. The method in claim 1, further comprising a step of curing said dielectric layer.

10. The method in claim 1, further comprising a step of forming a metal or conductive layer on the sidewall of said die receiving through hole of said substrate.

11. The method in claim 1, further comprising a step of cleaning top surface of said package before forming said bonding wire.

12. A method for forming a semiconductor device package, comprising:

providing a substrate with at least a die receiving through hole, connecting through holes structure and first contact pads on an upper surface and second contact pads on a lower surface of said substrate;

bonding said substrate to a die redistribution tool;

redistributing desired at least first die having first bonding pads on said die redistribution tool with desired pitch by a pick and place fine alignment system;

forming a first bonding wire to connect said first bonding pads to said contact pads;

placing at least a second die having second bonding pads disposed on said first die;

forming a second bonding wire to connect said second bonding pads and said first contact pads;

forming a dielectric layer on the active surface of said first and second die and upper surface of said substrate and fill into the gap between dice edge and sidewall of said die receiving through hole of said substrate;

separating said package structure from said die redistribution tool; and mounting said package structure on a tape to saw into individual die for singulation.

13. The method in claim 12, further comprising a step of welding a plurality of conductive bumps on said second contact pads.

14. The method in claim 13, wherein said step of forming said conductive bumps is performed by an infrared (IR) reflow method.

15. The method in claim 13, wherein said step of forming said conductive bumps on said second contact pad is performed by solder paste.

16. The method in claim 12, further comprising a step of sticking backside surface of said first die on said die redistribution tool printed by patterned glues.

17. The method in claim 12, further comprising a step of curing said dielectric layer.

18. The method in claim 12, further comprising a step of forming a first adhesion material on the back side of said first die.

19. The method in claim 12, further comprising a die attached tape formed on the back side of said second die.

20. The method in claim 19, wherein material of said die attached tape includes elastic material.

21. The method in claim 12, further comprising a step of forming a metal layer on the sidewall of said die receiving through holes of said substrate.

* * * * *